United States Patent [19]

Naito

[11] Patent Number: 4,484,146
[45] Date of Patent: Nov. 20, 1984

[54] DIFFERENTIAL AMPLIFIER CONTAINING A LOW-PASS FILTER

[75] Inventor: Kazufumi Naito, Otsu, Japan

[73] Assignee: Kabushiki Kaisha Ishida Koki Seisakusho, Japan

[21] Appl. No.: 390,886

[22] Filed: Jun. 22, 1982

[30] Foreign Application Priority Data

Jun. 30, 1981 [JP] Japan ................................ 56-103015

[51] Int. Cl.³ ............................................ H03F 3/45
[52] U.S. Cl. .................................... 330/69; 330/107; 330/147; 330/260; 330/294; 330/306
[58] Field of Search ................. 330/69, 146, 147, 107, 330/260, 294, 302, 306

[56] References Cited

U.S. PATENT DOCUMENTS 3,619,800  11/1971  Lyghounis et al. ............. 330/69 X Primary Examiner—James B. Mullins
Attorney, Agent, or Firm—Lowe, King, Price & Becker

[57] ABSTRACT

A differential amplifier which incorporates at its preceding stage resistances and condensers combined with each other and serving as a low-pass filter, thereby omitting a conventional low-pass filter separate from a differential amplifier provided at a weight detection circuit for a load cell weighing scale or other detection circuit.

3 Claims, 4 Drawing Figures

4,484,146

DIFFERENTIAL AMPLIFIER CONTAINING A LOW-PASS FILTER

FIELD OF THE INVENTION

This invention relates to a differential amplifier containing therein a low-pass filter, and more particularly to a differential amplifier containing therein a low-pass filter and used for a weight detection circuit at a load cell weighing scale.

BACKGROUND OF THE INVENTION

The conventional weight detection circuit for the load cell weighing scale, as shown in FIG. 1 is adapted to amplify by a high input impedance type differential amplifier 2 an output of a bridge circuit 1 of strain gauge resistances for the load cell, that is, analog voltage proportional to the weight, so that the output is fed into an analog-to-digital converter 4 through a low-pass filter 3. Here, the low-pass filter 3 is necessary for reducing vibrations and noises produced by mechanical and electrical factors and the differential amplifier 22 is indispensable for differential amplification of a weight signal from the bridge circuit 1 of load cell (wherein the differential amplifier serves as a part of the high input impedance type differential amplifier). It will of course increase the number of operational amplifiers to constitute the low-pass filter 3 and differential amplifier 22 separate from each other. Hence, there is a defect of increasing the hazard rate and being expensive to produce.

SUMMARY OF THE INVENTION

In the light of the above problems, this invention has been designed. A differential amplifier of the invention has at the preceding stage resistances and condensers connected in combination so as to function as the low-pass filter, and also operates as the secondary low-pass filter when given the output of the senser, such as the bridge circuit of load cell, thereby simultaneously demonstrating the function as the differential amplifier as the same as the conventional one.

Even when given the output directly from the bridge circuit of load cell not through the high input impedance type amplifier, the differential amplifier of the invention functions as the secondary low-pass filter in relation to each strain gauge resistance of the bridge circuit of load cell, in which its function as the differential amplifier will of course be demonstrated.

An object of the invention is to provide a differential amplifier which can simplify a circuit for digitalconverting the output from various sensors, such as the bridge circuit for the load cell and disposed between the sensor and an analog-to-digital converter.

These and other objects of the invention will become more apparent in the detailed description in accordance with the accompanying drawings.

BRIEF DESCRIPTION OF THE DRAWINGS

FIGS. 3 and 4 are circuit diagrams exemplary of the weight detection circuits at the load cell weighing scale, to which the circuit of the invention is applied, in which FIG. 3 is a circuit diagram of the differential amplifier of the invention, which is connected to a bridge circuit of load cell through a high input impedance type amplifier, and FIG. 4 is a circuit diagram of the same, which is connected directly to the bridge circuit of load cell not through the high input impedance type amplifier.

DETAILED DESCRIPTION OF THE INVENTION

Paying attention to that the low-pass filter and the differential amplifier both include operational amplifiers, this invention has been designed and will be detailed in the following description in accordance with the drawings.

Figure 1:
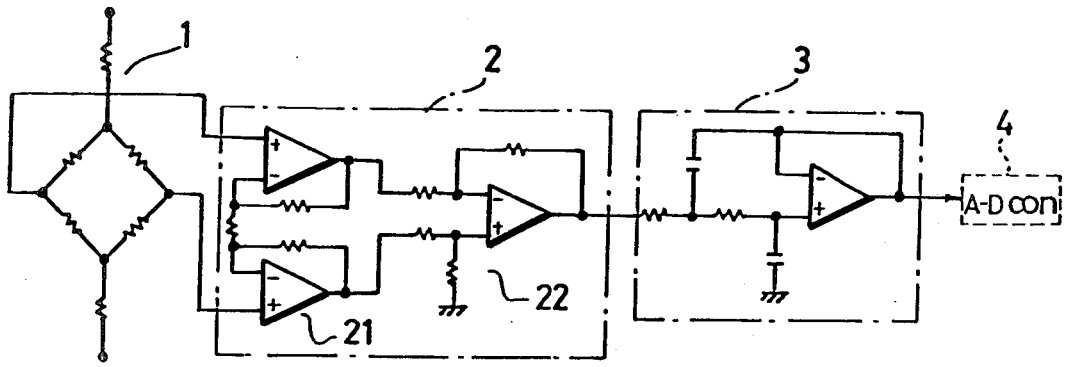
FIG. 1 is a circuit diagram of a weight detection circuit of the conventional load cell weighing scale.
Figure 2:
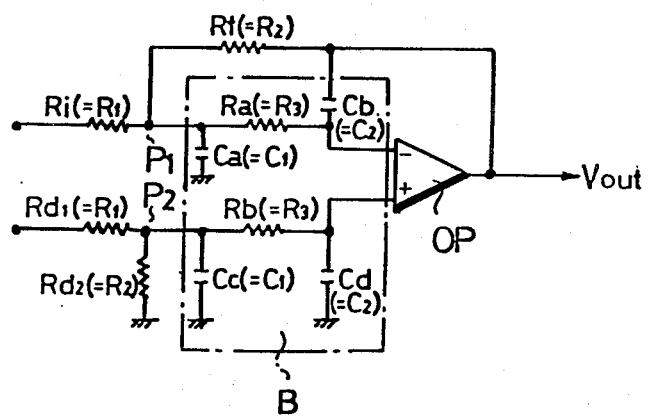
FIG. 2 is a circuit diagram of an embodiment of a differential amplifier of the invention.

FIG. 2 shows an embodiment of the invention, in which a filter unit B to be discussed below is added to a conventional differential amplifier and resistances and capacity of each condenser in use are under a fixed condition.

At first, a first resistance $R_a$ is interposed between a negative input terminal of an operational amplifier (OP) and the node $P_1$ of an input resistance $R_i$ and feedback resistance $R_f$ at the differential amplifier, and is grounded at the input resistance $R_i$ side through a first condenser $C_a$ and connected at the OP's negative input side to the output line of the operational amplifier through a second capacitor $C_b$.

A second resistance $R_b$ is connected to between the node P2 of a not-grounded voltage-dividing resistance $R_{d1}$ and grounded voltage-dividing resistance $R_{d2}$ and the positive input line of the operational amplifier (OP), and is grounded at the voltage-dividing resistances $R_{d1}$, $R_{d2}$ side through a third condenser $C_c$ and at the OP's positive input line side through a fourth condenser $C_d$.

Furthermore, an input resistance $R_i$ is made equal to not-grounded voltage-dividing resistance $R_{d1}$, a feedback resistance $R_f$ equal to grounded voltage-dividing resistance $R_{d2}$ first resistance $R_a$ equal to second resistance $R_b$, capacity of first condenser $C_a$ equal to that of third condenser $C_c$, and capacity of second condenser $C_b$ equal to that of fourth condenser $C_d$, as $R_i = R_{d1} = R_1$, $R_f = D_{d2} = R_2$, $R_a = R_b = R_3$, $C_a = C_c = C_1$ and $C_b = C_d = C_2$.

Figure 3:
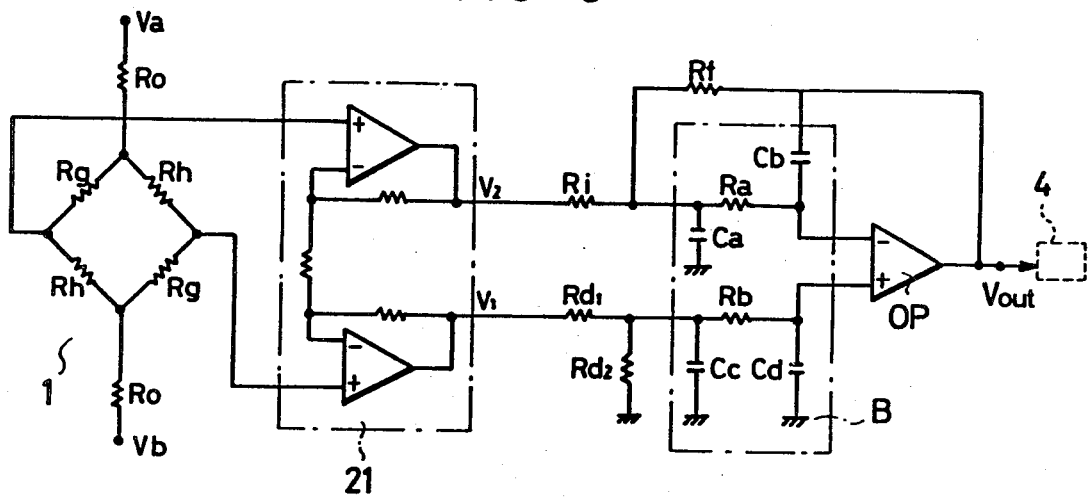

The differential amplifier containing the low-pass filter, constructed as foregoing, generally uses the high input impedance type amplifier connected to the preceding stage of the differential amplifier as exemplary in FIG. 3.

FIG. 3 shows the differential amplifier applied to a weight detection circuit for a load cell weighing scale, in which the output of the bridge circuit 1 for the load cell is given through the high input impedance type amplifier 21 to the differential amplifier containing the low-pass filter. The high input impedance type amplifier, when used in the above circuit constitution, functions to cancel the mutual influence between the bridge circuit 1 and the differential amplifier, thereby facilitating the design as discussed below.

Now, the node equation is set up at each node and Laplace-transformed, then a complex (frequency region) function Vout(S) is obtained as:

$$V_{out}(S) = \frac{\frac{1}{C_1 \cdot C_2 \cdot R_1 \cdot R_3}}{S^2 + S\frac{1}{C_1}\left(\frac{1}{R_1} + \frac{1}{R_2} + \frac{1}{R_3}\right) + \frac{1}{C_1 \cdot C_2 \cdot R_2 \cdot R_3}} [V_1(S) - V_2(S)] \quad (1)$$

where
V1, V2: Output voltage of high input impedance type amplifier, and
S: Complex variable (Laplace operator).

Since the denominator of Equation (1) is the secondary function of S, this circuit can be seen to operate as the secondary low-pass filter.

Equation (1), in a direct current fashion, becomes $$V_{out} = R_2/R_1(V_1 - V_2) \ldots \quad (2),$$

whereby the function as the differential amplifier is quite the same as before addition of the filter unit B. Hence, in this case, there is no need of making uniform the temperature characteristics of resistances R1, R2 and of each strain gauge at the bridge circuit 1, but it is enough to make uniform the temperature characteristics (a) input resistance $R_i$ and feedback resistance $R_f$ and (b) voltage dividing resistances $R_{d1}$ and $R_{d2}$, at each group of (a) and (b).

Consequently, various sensors are available instead of the bridge circuit 1 as far as this invention is generally used as the above.

Figure 4:
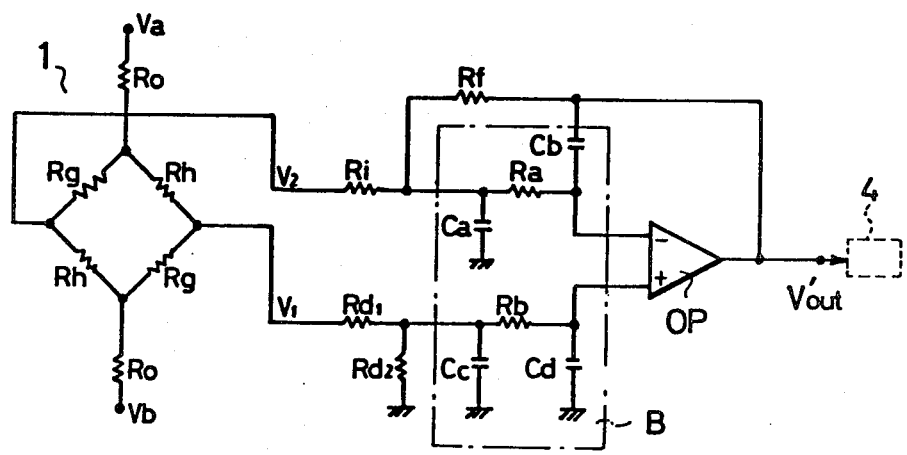

Now, in a case of using the differential amplifier of the invention containing the low-pass filter and connected to the bridge circuit 1 of load cells, even when the high input impedance type amplifier is omitted as shown in FIG. 4, the functions as the low-pass filter and differential amplifier are demonstrated in relation to the bridge circuit 1.

The node equation is set up at each node at the circuit in FIG. 4 and is Laplace-transformed, then the complex (frequency region) function $V'_{out}(S)$ of the FIG. 4 circuit is obtained as:

Since Equation (3) has the denominator of the secondary function of S, it can be seen that this circuit operates as the low-pass filter, where Equation (3), as seen in comparison with Equation (1), contains strain gauge resistances $R_g$, $R_h$ or temperature compensating resistance $R_0$ at the bridge circuit 1, whereby it can be seen to operate as the low-pass filter in relation to the bridge circuit 1. The amplification factor for the differential amplifier similarly relates to the strain gauge resistance of bridge circuit 1.

Namely, in a direct current fashion, $$V_{out} = \frac{2R_2}{R + 2R_1}(V_1 - V_2), \quad (4)$$

where
R: Values of strain gauge resistances $R_g$, $R_h$ during no load.

Accordingly, in the above case, it is necessary to make uniform the temperature characteristics of all the strain gauge resistances $R_g$, $R_h$ and resistances $R_i$, $R_f$, $R_{d1}$, $R_{d2}$, $R_a$, and $R_b$ at the differential amplifier.

As seen from the above, the differential amplifier of the invention, which contains the low-pass filter, is advantageous in saving the number of operational amplifiers, keeping less hazard rate, and lowering the manufacturing cost. Especially, the differential amplifier, when connected directly with the bridge circuit of load cell, can omit the high input impedance type amplifier, thereby further improving the above effect.

While preferred embodiments of the invention have been described using specific terms, such description is for illustrative purpose only, and it is understood that changes and variations may be made without departing from the spirit or scope of the following claims.

$$V_{out}(S) = \frac{1}{C_1 \cdot C_2 \cdot R_1 \cdot R_3} \cdot \frac{\frac{1}{R_0}\left(\frac{1}{R_h} - \frac{1}{R_g}\right)[V_a(S) - V_b(S)]}{\left(\frac{1}{R_g} + \frac{1}{R_h} + \frac{1}{R_1}\right)\left(\frac{1}{R_g} + \frac{1}{R_h} + \frac{1}{R_0}\right) - \left(\frac{1}{R_h} - \frac{1}{R_g}\right)^2} \bigg/ \left[S^2 + S\frac{1}{C_1}\left(\frac{1}{R_1} + \frac{1}{R_2} + \frac{1}{R_3}\right) + \frac{1}{C_1 \cdot C_2 \cdot R_2 \cdot R_3} - \frac{1}{C_1 \cdot C_2 \cdot R_1 \cdot R_3} \cdot \frac{\frac{1}{R_1}\left(\frac{1}{R_g} + \frac{1}{R_h} + \frac{1}{R_0}\right) S \cdot C_2 \cdot R_3}{\left(\frac{1}{R_g} + \frac{1}{R_h} + \frac{1}{R_1}\right)\left(\frac{1}{R_g} + \frac{1}{R_h} + \frac{1}{R_0}\right) - \left(\frac{1}{R_g} - \frac{1}{R_h}\right)^2}\right] \quad (3)$$

where
$V_a$, $V_b$: Applied voltage to bridge circuit,
$R_g$, $R_b$: Each strain gauge resistance in bridge circuit, and
$R_0$: Temperature compensating resistance of load cell.

What is claimed is:
1. A differential amplifier containing therein a low-pass filter, characterized in that said amplifier comprises:

a first resistance connected between the node of an input resistance and a feedback resistance at said differential amplifier and the negative input line of an operational amplifier, a first condenser for grounding said first resistance at the input resistance side, a second condenser for connecting said first resistance at a side of the negative input line side of said operational amplifier with the output line thereof, a second resistance connected between the node of a not-grounded voltage dividing resistance and a grounded voltage dividing resistance and the positive input line of said operational amplifier, a third condenser for grounding said second resistance at the voltage dividing resistance side, and a fourth condenser for grounding said second resistance at a side of the positive input line of said operational amplifier, so that said input resistance is made equal to said not-grounded voltage dividing resistance, said feedback resistance equal to said grounded voltage dividing resistance, said first resistance equal to said second resistance, capacity of said first condenser equal to that of said third condenser, and capacity of said second condenser equal to that of said fourth condenser.

2. A differential amplifier containing therein a low-pass filter according to claim 1, characterized in that each output of a high input impedance type amplifier is connected to each input side of said input resistance and not-grounded voltage dividing resistance in said differential amplifier.

3. A differential amplifier containing therein a low-pass filter according to claim 1, characterized in that each output of a bridge circuit of a load cell is connected to each input side of said input resistance and not-grounded voltage dividing resistance in said differential amplifier.

* * * * *